United States Patent
Lee et al.

(10) Patent No.: US 9,484,104 B2
(45) Date of Patent: Nov. 1, 2016

(54) NONVOLATILE MEMORY SYSTEM WITH BLOCK MANAGING UNIT AND METHOD OF OPERATING THE SAME

(71) Applicants: Byung-Ki Lee, Hwaseong-si (KR); Hee-Tai Oh, Goyang-si (KR)

(72) Inventors: Byung-Ki Lee, Hwaseong-si (KR); Hee-Tai Oh, Goyang-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/636,577

(22) Filed: Mar. 3, 2015

(65) Prior Publication Data
US 2015/0255161 A1 Sep. 10, 2015

(30) Foreign Application Priority Data
Mar. 4, 2014 (KR) .................. 10-2014-0025605

(51) Int. Cl.
| | | |
|---|---|---|
| *G11C 16/04* | (2006.01) | |
| *G11C 16/16* | (2006.01) | |
| *G11C 16/34* | (2006.01) | |
| *G11C 16/08* | (2006.01) | |
| *G06F 12/02* | (2006.01) | |

(52) U.S. Cl.
CPC .......... *G11C 16/16* (2013.01); *G11C 16/3445* (2013.01); *G06F 12/0246* (2013.01); *G11C 16/0483* (2013.01); *G11C 16/08* (2013.01)

(58) Field of Classification Search
CPC ... G11C 16/16; G11C 16/14; G11C 16/3445; G11C 16/08; G06F 12/0246
USPC .................... 365/185.12, 185.11, 185.29; 711/102–103
See application file for complete search history.

(56) References Cited

U.S. PATENT DOCUMENTS

| | | | |
|---|---|---|---|
| 7,433,993 B2 * | 10/2008 | Sinclair ............... | G06F 12/0246 711/103 |
| 7,532,531 B2 | 5/2009 | Lee | |
| 7,542,353 B2 | 6/2009 | Park | |
| 7,623,381 B2 | 11/2009 | Park | |
| 7,631,138 B2 | 12/2009 | Gonzalez et al. | |
| 7,679,133 B2 | 3/2010 | Son et al. | |
| 7,940,564 B2 | 5/2011 | Park et al. | |
| 8,014,208 B1 | 9/2011 | Ferrante et al. | |
| 8,095,765 B2 | 1/2012 | Asnaashari et al. | |
| 8,117,381 B2 | 2/2012 | Gonzalez et al. | |
| 8,176,238 B2 | 5/2012 | Yu et al. | |
| 8,239,643 B2 * | 8/2012 | Gorobets ............ | G06F 11/1072 711/103 |
| 8,391,043 B2 | 3/2013 | Shim et al. | |

(Continued)

FOREIGN PATENT DOCUMENTS

| | | |
|---|---|---|
| KR | 20020092261 A | 12/2002 |
| KR | 20060130084 A | 12/2006 |

(Continued)

*Primary Examiner* — David Lam
(74) *Attorney, Agent, or Firm* — Harness, Dickey & Pierce, P.L.C.

(57) ABSTRACT

According to example embodiments, a nonvolatile memory system includes a nonvolatile memory device and a memory controller. The nonvolatile memory device includes a plurality of planes and each plane includes a plurality of memory blocks. The memory controller is configured to classify the memory blocks of each of the planes into a plurality of groups. The memory controller is configured to select at least two memory blocks in a corresponding one of the groups, and to control the nonvolatile memory device so that the selected at least two memory blocks are multi-block erased.

20 Claims, 17 Drawing Sheets

(56) References Cited

U.S. PATENT DOCUMENTS

| | | |
|---|---|---|
| 8,447,914 B2 | 5/2013 | Yano et al. |
| 8,463,986 B2 | 6/2013 | Yamazaki et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,981,457 B2 * | 3/2015 | Lee .................. G11C 16/3427 257/321 |
| 2005/0144357 A1 | 6/2005 | Sinclair |
| 2005/0144361 A1 | 6/2005 | Gonzalez et al. |
| 2007/0263457 A1 | 11/2007 | Park |
| 2008/0025100 A1 | 1/2008 | Lee |
| 2008/0101119 A1 | 5/2008 | Park |
| 2009/0168534 A1 | 7/2009 | Park et al. |
| 2010/0228940 A1 | 9/2010 | Asnaashari et al. |
| 2011/0022784 A1 | 1/2011 | Yano et al. |
| 2011/0149629 A1 | 6/2011 | Shim et al. |
| 2011/0191530 A1 | 8/2011 | Gonzalez et al. |
| 2011/0213921 A1 | 9/2011 | Yu et al. |
| 2011/0233648 A1 | 9/2011 | Seol et al. |
| 2011/0302361 A1 | 12/2011 | Yamazaki et al. |
| 2012/0195123 A1 | 8/2012 | Lee |

FOREIGN PATENT DOCUMENTS

| | | |
|---|---|---|
| KR | 100739256 B1 | 7/2007 |
| KR | 100784007 B1 | 12/2007 |
| KR | 100914646 B1 | 8/2009 |
| KR | 101014599 B1 | 2/2011 |
| KR | 20110072703 A | 6/2011 |
| KR | 101060899 B1 | 8/2011 |
| KR | 20110107845 A | 10/2011 |
| KR | 101269366 | 5/2013 |
| WO | WO-2009110302 A1 | 9/2009 |

* cited by examiner

FIG. 9

| Classified Group | Block |
|---|---|
| Group 1 (GR1) | BLK11, BLK12, BLK13 |
| Group 2 (GR2) | BLK15, BLK16, BLK17 |
| Group 3 (GR3) | BLK21, BLK22, BLK23, BLK24 |
| Group 4 (GR4) | BLK25, BLK26, BLK27 |
| Single Block | BLK19, BLK20, BLK29 |

NONVOLATILE MEMORY SYSTEM WITH
BLOCK MANAGING UNIT AND METHOD
OF OPERATING THE SAME

CROSS-REFERENCE TO RELATED
APPLICATIONS

The present application claims priority under 35 U.S.C. §119 to Korean Patent Application No. 10-2014-0025605, filed on Mar. 4, 2014, in the Korean Intellectual Property Office, the entire contents of which are hereby incorporated by reference.

TECHNICAL FIELD

The present disclosure relates to semiconductor memories, and more particularly, to a nonvolatile memory device and a nonvolatile memory system including a memory controller.

BACKGROUND

A semiconductor memory device may include at least one semiconductor such as silicon Si, germanium Ge, gallium arsenide GaAs, indium phosphide InP, etc. A semiconductor memory device may be classified as a volatile semiconductor memory device or a nonvolatile semiconductor memory device.

A volatile memory device loses its stored data when its power supply is interrupted. Examples of the volatile memory device include a static RAM (SRAM), a dynamic RAM (DRAM), a synchronous DRAM (SDRAM), etc. A nonvolatile memory device retains its stored data even when its power supply is interrupted. Examples of the nonvolatile memory device include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

As a semiconductor technology is developed, a storage device based on a flash memory is being developed. A flash memory reads or writes data by a page unit and performs an erase operation by a block unit. Even though a flash memory has a high read speed compared with a conventional hard disk, it has a physical characteristic that cannot perform an overwrite operation. A lot of time may be consumed in an erase operation due to the physical characteristic of the flash memory.

SUMMARY

According to example embodiments of inventive concepts, a nonvolatile memory system includes a nonvolatile memory device including a plurality of planes, each of the planes including a plurality of memory blocks; and a memory controller configured to classify the memory blocks of each of the planes into a plurality of groups, respectively, select at least two of the plurality of memory blocks in one of the plurality of groups, and control the nonvolatile memory device so the selected at least two memory blocks are multi-block erased. Each of the plurality of memory blocks includes a plurality of cell strings, and each cell string includes a plurality of memory cells stacked on top of each other between a ground select transistor and a string select transistor.

In exemplary embodiments, the memory controller further includes a multi block managing unit configured to classify the plurality of memory blocks into the plurality of groups; and a single block managing unit configured to manage memory blocks that are not classified into the groups among the plurality of memory blocks in each of the planes.

In exemplary embodiments, the multi block managing unit is configured to select the at least two memory blocks in the one of the plurality of the groups.

In exemplary embodiments, the memory controller is configured to transmit a multi block erase command and a multi block address of the at least two memory blocks to the nonvolatile memory device.

In exemplary embodiments, the nonvolatile memory device is configured to perform a multi block erase operation on the at least two memory blocks in response to the multi block erase command.

In exemplary embodiments, the multi block erase operation includes a plurality of erase loops. Each of the erase loops includes applying an erase voltage to a substrate of the at least two memory blocks, and verifying an erase state of each of the at least two memory blocks.

In exemplary embodiments, the nonvolatile memory device is configured to transmit an erase verify result to the memory controller while performing the multi block erase operation, based on the verification.

In exemplary embodiments, the memory controller is configured to set a memory block that is completely erased among the at least two memory blocks to a free memory block on the basis of the erase verify result.

In exemplary embodiments, the nonvolatile memory device includes an address decoder. The address decoder includes a plurality of block driving units connected to the memory blocks, configured to decode the multi block address and select memory blocks corresponding to the multi block address among the plurality of memory blocks. The memory controller is configured to classify the plurality of memory blocks into the plurality of groups on the basis of coding information of the address decoder indicating corresponding relationship information between the plurality of block driving units and the plurality of memory blocks.

In exemplary embodiments, the each of the plurality of memory blocks comprises a non-volatile memory that is monolithically formed in one or more physical levels of memory cells having active areas disposed above a silicon substrate.

In exemplary embodiments, the memory blocks included in each of the planes share the bit line.

According to example embodiments of inventive concepts, an method of operating a nonvolatile memory system including a nonvolatile memory device and a memory controller configured to control the nonvolatile memory device, the nonvolatile memory device including a plurality of memory blocks is provided. The method comprises classifying the plurality of memory blocks into a plurality of groups using the memory controller, selecting at least two memory blocks in one of the plurality of groups using the memory controller; transmitting a multi block address and a multi block erase command using the memory controller to the nonvolatile memory device on the basis of the selected at least two memory blocks; and performing a multi block erase operation on memory blocks corresponding to the multi block address in response to the nonvolatile memory device receiving the multi block erase command. Each of the plurality of memory blocks includes a plurality of cell strings, and each cell string includes a plurality of memory cells stacked on top of each other between a ground select transistor and a string select transistor.

In exemplary embodiments, the selecting at least two memory blocks in one of the plurality of groups includes selecting the at least two memory blocks from a same group among the plurality of groups; and selecting the at least two memory blocks from memory blocks having an invalid state among the memory blocks in the same group.

In exemplary embodiments, the method further comprises transmitting an erase verify result of the multi block erase operation to the memory controller before the multi block erase operation is completed.

In exemplary embodiments, the method further comprises setting a memory block that is completely erased among the at least two memory blocks to a free block on the basis of the received erase verify result using the memory controller.

According to example embodiments of inventive concepts, a nonvolatile memory system comprises a nonvolatile memory device including a plurality of planes, each of the planes including a plurality of memory blocks; and a memory controller configured to designate at least two memory blocks in a same plane among the plurality of planes as a multi block, and control the nonvolatile memory device so that at least two memory blocks of the multi block are erased during a multi block erase operation. Each of the plurality of memory blocks includes a plurality of cell strings, and each cell string includes a plurality of memory cells stacked on top of each other between a ground select transistor and a string select transistor.

In exemplary embodiments, the nonvolatile memory device includes an address decoder including a plurality of block driving units connected to the plurality of memory blocks through a plurality of word lines, the memory controller is configured to designate the at least two memory blocks as the multi block by transmitting to the nonvolatile memory device a multi block address corresponding to two or more of the memory blocks that are connected in common to one of the block driving units, the address decoder is configured to decode the multi block address and to select the at least two memory blocks of the multi block based on the decoded multi block address, and the memory controller is configured to transmit a multi block erase command to the nonvolatile memory device, and the nonvolatile memory device is configured to erase the memory blocks of the multi block during the multi block erase operation in response to receiving the multi block erase command.

In exemplary embodiments, the memory controller is configured to classify the plurality of memory blocks into a plurality of groups based on the memory blocks that are connected to a same one of the block driving units, the memory controller is configured to determine if one of the plurality of groups includes a bad block, the memory controller is configured to associate a logical address corresponding to the bad block with a physical address of a normal block from a different one of the plurality of groups if the bad block exists in the one of the plurality of groups, and the memory controller is configured to exclude the bad block from being included with the at least two memory blocks designated as the multi block, In exemplary embodiments, the nonvolatile memory device includes a page buffer connected to the plurality of memory blocks through a plurality of bit lines, and the memory blocks of each one of the planes are connected in common to a corresponding one of the bit lines.

In exemplary embodiments, the each of the plurality of memory blocks comprises a non-volatile memory that is monolithically formed in one or more physical levels of memory cells having active areas disposed above a silicon substrate.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 9 is a drawing for explaining a relation between a plurality of memory blocks and a plurality of groups.

DETAILED DESCRIPTION OF EXAMPLE EMBODIMENTS

Figure 1:
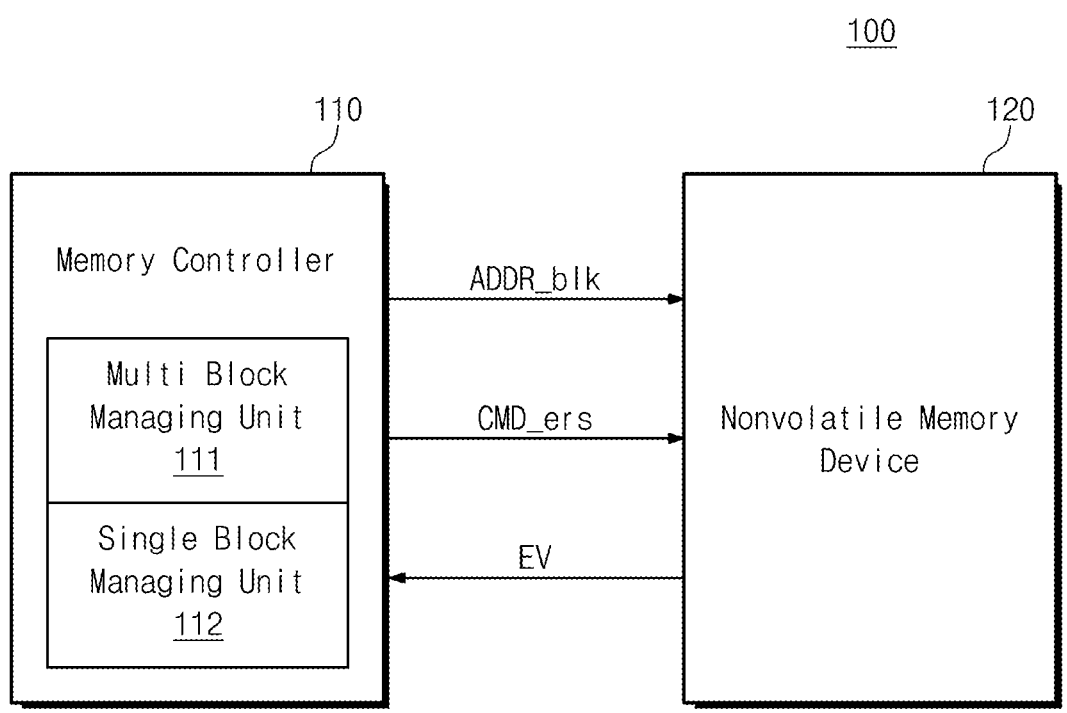
FIG. 1 is a block diagram illustrating a nonvolatile memory system according to example embodiments of inventive concepts.

Example embodiments of inventive concepts will be described more fully hereinafter with reference to the accompanying drawings, in which some example embodiments are shown. Example embodiments of inventive concepts may, however, be embodied in many different forms and should not be construed as limited to the embodiments set forth herein. Rather, these embodiments are provided so that this disclosure will be thorough and complete, and will fully convey the scope of example embodiments of inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

A nonvolatile memory system according to example embodiments of inventive concepts includes a memory controller and a nonvolatile memory device. The memory controller may control the nonvolatile memory device so that at least two memory blocks among a plurality of memory blocks included in the nonvolatile memory device are erased at the same time. That is, the nonvolatile memory system may support a multi block erase operation. At this time, the at least two memory blocks may be included in one among planes in the nonvolatile memory device.

FIG. 1 is a block diagram illustrating a nonvolatile memory system according to example embodiments of inventive concepts. Referring to FIG. 1, a nonvolatile memory system 100 includes a memory controller 110 and a nonvolatile memory device 120. The memory controller 110 may control the nonvolatile memory device 120 so that data written in the nonvolatile memory device 120 is erased. For example, the nonvolatile memory device 120 may include a plurality of memory blocks. Each of the memory blocks may include a plurality of pages. The nonvolatile memory device 120 may read and write data by a page unit. The nonvolatile memory device 120 may erase data by a block unit. Because of a physical characteristic of the nonvolatile memory device 120, a part of the memory blocks may be invalid memory blocks including invalid data.

When the nonvolatile memory device 120 is in an idle state for a desired (and/or alternatively predetermined) time, the memory controller 110 may erase invalid memory blocks. The memory controller 110 may erase invalid memory blocks in response to a request (e.g., a trim request) received from an external device (for example, a host, an application processor, etc.). The erased memory blocks may be managed as a free block by the memory controller 110.

The memory controller 110 may transmit a multi block erase command CMD_ers and a multi block address ADDR_blk to the nonvolatile memory device 120 to perform the erase operation described above. The multi block erase command CMD_ers may be a command for erasing a plurality of memory blocks. The multi block address ADDR_blk may be an address corresponding to a plurality of memory blocks. The multi block address ADDR_blk may include a block address of each of at least two memory blocks. That is, the memory block 110 may control the nonvolatile memory device 120 so that the nonvolatile memory device 120 erases at least two memory blocks (hereinafter it is referred to as 'multi block').

A multi block indicates at least two memory blocks included in one plane. The plane includes a plurality of memory blocks and a plurality of memory blocks included in one plane shares same bit lines. Alternatively, the plurality of memory blocks included in one plane shares one page buffer circuit. In example embodiments, the plane and the memory blocks is described in detail with reference to FIGS. 4 and 5.

The memory controller 110 may include a multi block managing unit 111 and a single block managing unit 112. The multi block managing unit 111 may classify a plurality of memory blocks included in the nonvolatile memory device 120 into desired (and/or alternatively predetermined) groups.

For example, the nonvolatile memory device 120 may include first through eighth memory blocks. The multi block managing unit 111 may classify the first to fourth memory blocks into a first group and classify the fifth to eighth memory blocks into a second group. The multi block managing unit 111 may select at least two memory blocks. The selected two memory blocks may be included in any one of a plurality of memory groups. The multi block managing unit 111 may classify the memory blocks on the basis of block address coding information. The block address coding information will be described in detail with reference to FIGS. 7 and 8.

The single block managing unit 112 may manage memory blocks that are not classified by the multi block managing unit 111. For example, a part of memory blocks may be bad blocks. In this case, the memory controller 110 may replace a block address corresponding to a bad block with a block address of a normal block. The single block managing unit 112 may manage memory blocks that are not classified by the multi block managing unit 111 due to replacing a bad block. Memory blocks managed by the single block managing unit 112 may not be selected as a multi block.

The nonvolatile memory device 120 may erase at least two memory blocks in response to the multi block erase command CMD_ers and the multi block address ADDR_blk received from the memory controller 110. The nonvolatile memory device 120 may perform an erase operation on the basis of a plurality of erase loops. Each of the erase loops includes an erase step of applying an erase voltage and an erase verify step of verifying an erase state. The nonvolatile memory device 120 may transmit an erase verify result EV with respect to a verify operation of each of the erase loops to the memory controller 110. The memory controller 110 may manage the erased memory blocks as a free block on the basis of the erase verify result EV received from the nonvolatile memory device 120.

Figure 2:
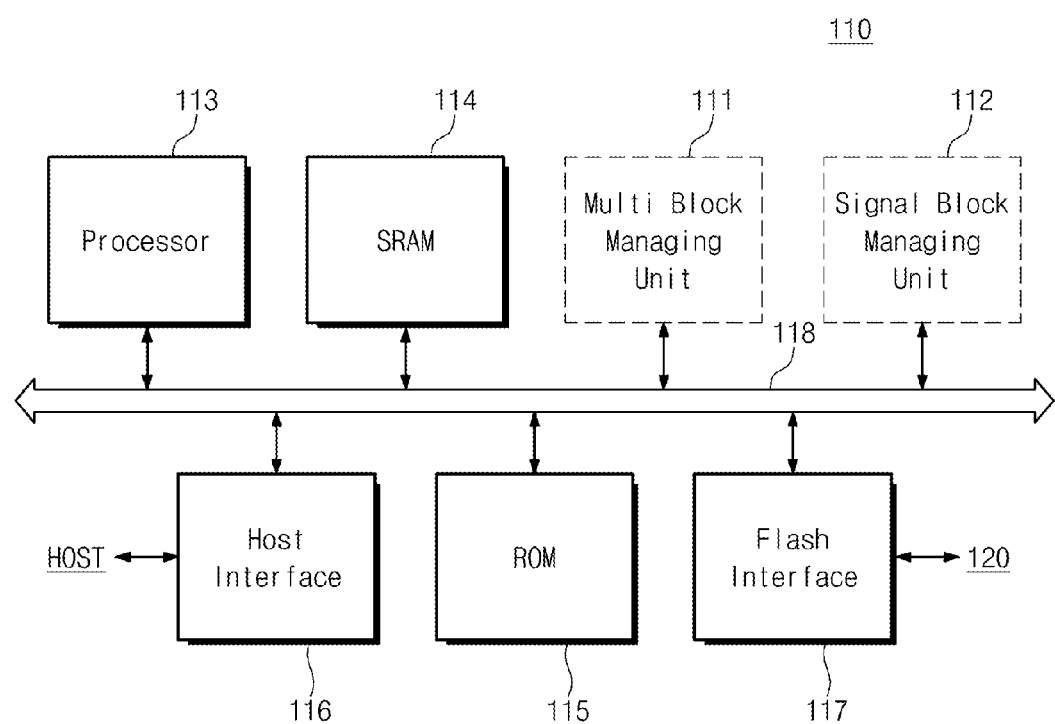
FIG. 2 is a block diagram illustrating a memory controller illustrated in FIG. 1 in detail.

FIG. 2 is a block diagram illustrating a memory controller illustrated in FIG. 1 in detail. Referring to FIGS. 1 and 2, the memory controller 110 includes a multi block managing unit 111, a single block managing unit 112, a processor 113, a SRAM 114, a ROM 115, a host interface 116, and a flash interface 117. In example embodiments, the processor 113 may be a hardware processor.

The multi block managing unit 111 may classify a plurality of memory blocks included in the nonvolatile memory device 120 into a plurality of groups. For example, the multi block managing unit 111 may classify at least two memory blocks among a plurality of memory blocks included in one plane into one group. The multi block managing unit 111 may classify at least two memory blocks among a plurality of memory blocks included in one plane into one group on the basis of block address coding information.

The single block managing unit 112 may manage memory blocks that are not classified by the multi block managing unit 111. For example, a plurality of memory blocks included in a first plane is classified into a plurality of groups by the multi block managing unit 111. At this time, a part of the memory blocks may be bad blocks. A flash translation layer FTL included in the memory controller 110 replaces a bad block with another memory block. The replaced memory block may not be classified into a group by the multi block managing unit 111. The single block managing unit 112 may manage those memory blocks (that is, memory blocks not classified into a group by the multi block managing unit 111).

The multi block managing unit 111 and the single block managing unit 112 may be provided in a firmware form. The multi block managing unit 111 and the single block managing unit 112 being provided in a firmware form are stored in the ROM 115 and may be driven by the processor 113. Alternatively, The multi block managing unit 111 and the single block managing unit 112 may be provided in a software form, and be stored in the SRAM 114, and be driven by the processor 113.

The memory controller 110 may select memory blocks to be erased on the basis of a group classified by the multi block managing unit 111 and perform a multi block erase operation with respect to the selected memory blocks. The memory controller 110 may perform a single block erase operation on memory blocks being managed by the single block managing unit 112. The multi block erase operation indicates an erase operation with respect to at least two memory blocks. The single block erase operation indicates an erase operation with respect to one memory block.

The processor 113 may control an overall operation of the memory controller 110. The SRAM 114 may operate as a main memory, an operation memory, a buffer memory or a cache memory of the processor 113. The ROM 115 may store information required when the memory controller 110 operates in a firmware form. The memory controller 110 may communicate with an external device (e.g., a host, AP, etc.) through the host interface 116. The memory controller 110 may communicate with the nonvolatile memory device 120 through the flash interface 117.

A system bus 118 is connected to the processor 113, the SRAM 114, the ROM 115, the host interface 116, and the flash interface 117 to provide a channel transmitting data and a signal.

Figure 3:
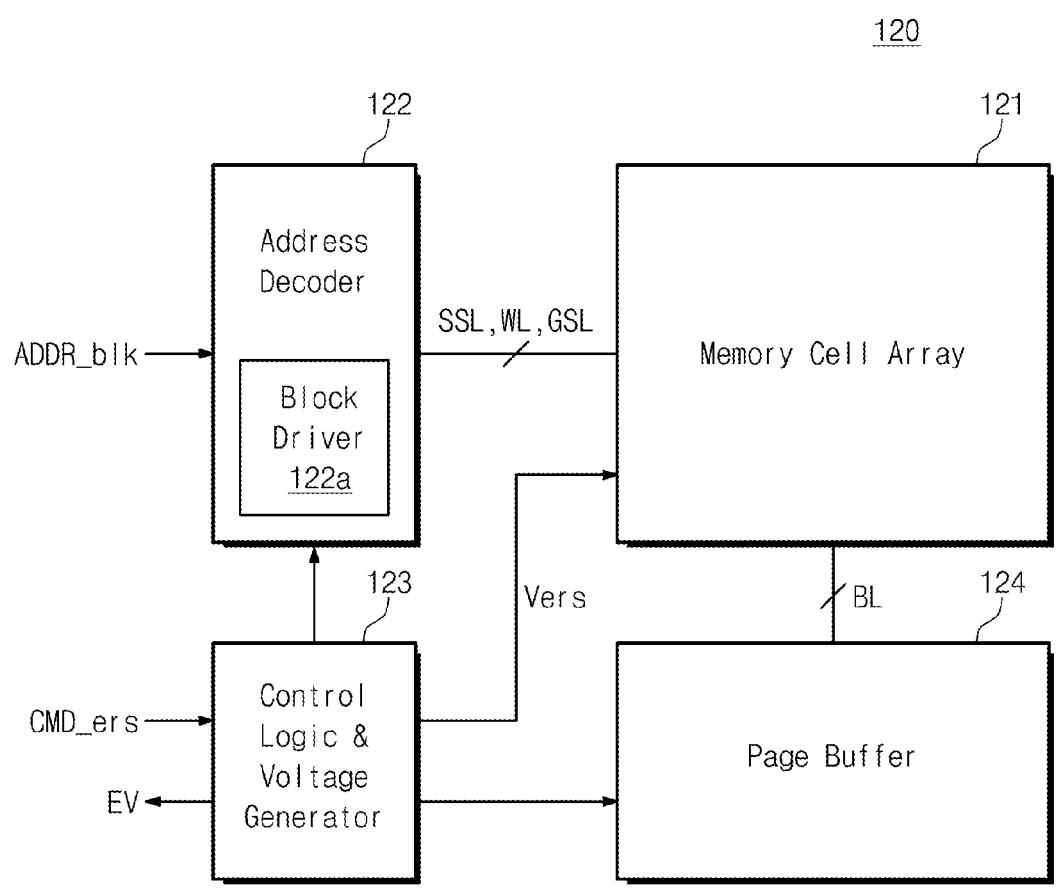
FIG. 3 is a block diagram illustrating a nonvolatile memory device illustrated in FIG. 1 in detail.

FIG. 3 is a block diagram illustrating a nonvolatile memory device illustrated in FIG. 1 in detail. Referring to FIG. 3, the nonvolatile memory device 120 includes a memory cell array 121, an address decoder 122, a control logic & voltage generator 123, and a page buffer 124.

The memory cell array 121 includes a plurality of planes. Each of the planes includes a plurality of memory blocks. Each of the memory blocks includes a plurality of strings. Each of the strings includes a plurality of memory cells. The memory cells are connected to a plurality of word lines respectively. Each of the memory cells may be provided as a single level cell (SLC) storing 1-bit data or a multi level cell (MLC) storing at least 2-bit data.

The address decoder 122 is connected to the memory cell array 121 through string select lines SSL, word lines WL, and ground select lines GSL. The address decoder 122 may include a block driver 122a. The block driver 122a may decode a multi block address ADDR_blk received from the memory controller 110 to select at least two among memory blocks included in the memory cell array 121. The block driver 122a may drive string select lines SSL, word lines WL and ground select lines GSL connected to the selected memory blocks.

The control logic & voltage generator 123 may control the address decoder 122 so that memory blocks corresponding to the multi block address ADDR_blk are erased in response to the multi block erase command CMD_ers received from the memory controller 110 and may apply an erase voltage to a substrate of the memory cell array 121. The control logic & voltage generator 123 may control the address decoder 122 and the page buffer 124 to verify the erased memory blocks. The control logic & voltage generator 123 may transmit an erase verify result EV to the memory controller 110.

The page buffer 124 is connected to the memory cell array 121 through a plurality of bit lines BL. The page buffer 124 may perform an erase verify operation of verifying whether an erase of the selected memory blocks is completed. The buffer memory 124 may sequentially perform an erase verify operation on the selected memory blocks.

Figure 4:
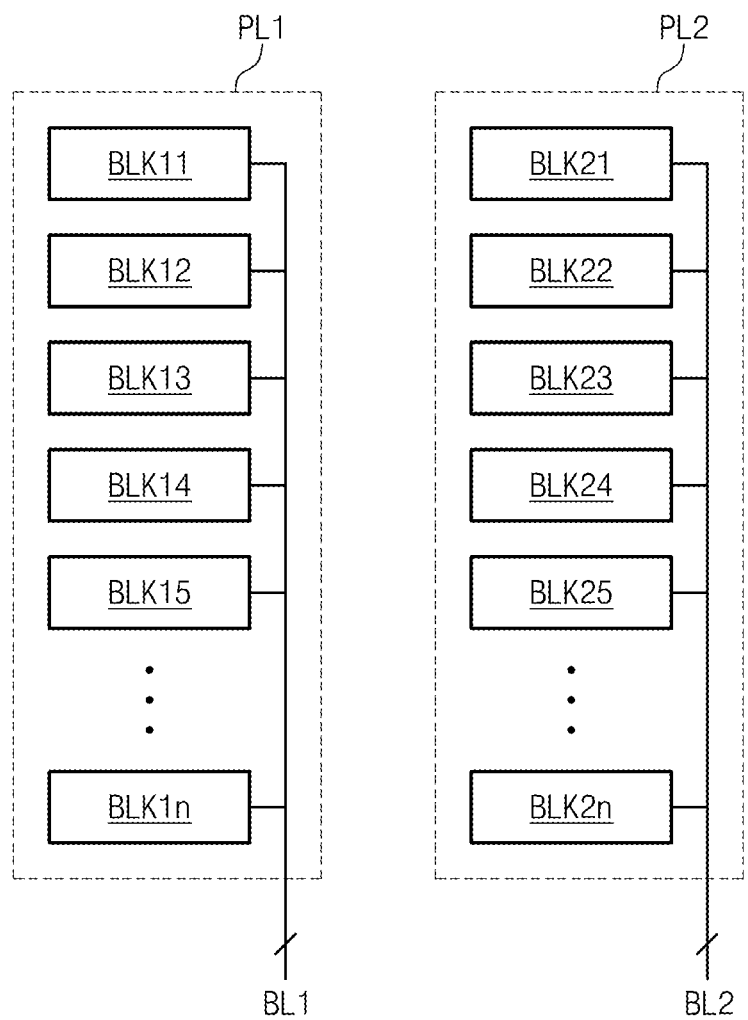
FIG. 4 is a block diagram illustrating a memory cell array illustrated in FIG. 3.

FIG. 4 is a block diagram illustrating a memory cell array illustrated in FIG. 3. Referring to FIGS. 3 and 4, the memory cell array 121 includes first and second planes PL1 and PL2. The first plane PL1 includes first through nth memory blocks BLK11~BLK1n. The second plane PL2 includes first through nth memory blocks BLK21~BLK2n.

The memory blocks (BLK11~BLK1n, BLK21~BLK2n) may be connected to the page buffer 124 through bit lines BL1 and BL2. For example, the memory blocks BLK11~BLK1n included in the first plane PL1 are connected to the page buffer 124 through the first bit line BL1. The memory blocks BLK21~BLK2n included in the second plane PL2 are connected to the page buffer 124 through the second bit line BL2. That is, the memory blocks BLK11~BLK1n included in the first plane PL1 share the first bit line BL1. The memory blocks BLK21~BLK2n included in the second plane PL2 share the second bit line BL2.

Although the first and second planes PL1 and PL2 are illustrated in FIG. 4, example embodiments of inventive concepts are not limited thereto and the memory cell array 121 may further include a plurality of planes.

Figure 5:
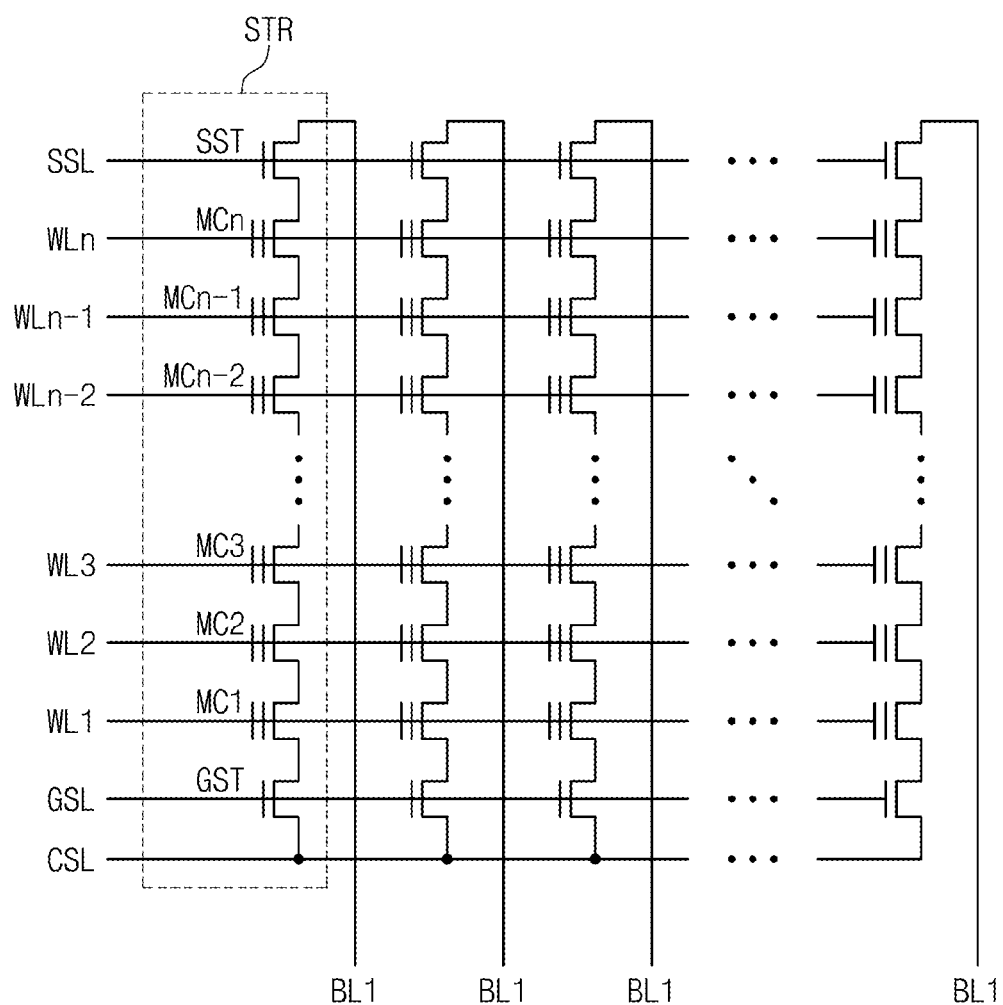
FIG. 5 is a circuit illustrating a memory block illustrated in FIG. 4.

FIG. 5 is a circuit illustrating a memory block illustrated in FIG. 4. The first memory block BLK11 included in the first plane PL1 is described with reference to FIG. 5. However, example embodiments of inventive concepts are not limited thereto and the other memory blocks (BLK12~BLK1n, BLK21~BLK2n) may also have the same structure as the first memory block BLK11.

Referring to FIGS. 4 and 5, the first memory block BLK11 includes a plurality of strings STR. Each string STR is connected to the page buffer 124 through first bit lines BL1.

Each string STR includes a string select transistor SST, a plurality of memory cells MC1~MCn and a ground select transistor GST. The memory cells MC1~MCn are serially connected to one another. The memory cells MC1~MCn are connected to a plurality of word lines WL1~WLn respectively. The ground select transistor GST is provided between the memory cells MC1~MCn and a common source line CSL. The string select transistor SST is connected between the memory cells MC1~MCn and the bit line BL1.

Although not illustrated in the drawing, dummy cells (not shown) may be further provided between the memory cells MC1~MCn and ground select transistor GST and between the memory cells MC1~MCn and the string select transistor SST. The dummy cells may be connected to dummy word lines (not shown). Although not illustrated in the drawing, the first memory block BLK11 may have a three-dimension structure.

As described above, the first memory block BLK11 includes a plurality of strings STR and each of the strings STR includes a plurality of memory cells MC1~MCn that are serially connected to one another, a string select transistor SST connected between the memory cells MC1~MCn and first bit lines BL1 and a ground select transistor GST connected between the memory cells MC1~MCn and a common source line CSL.

Figure 6:
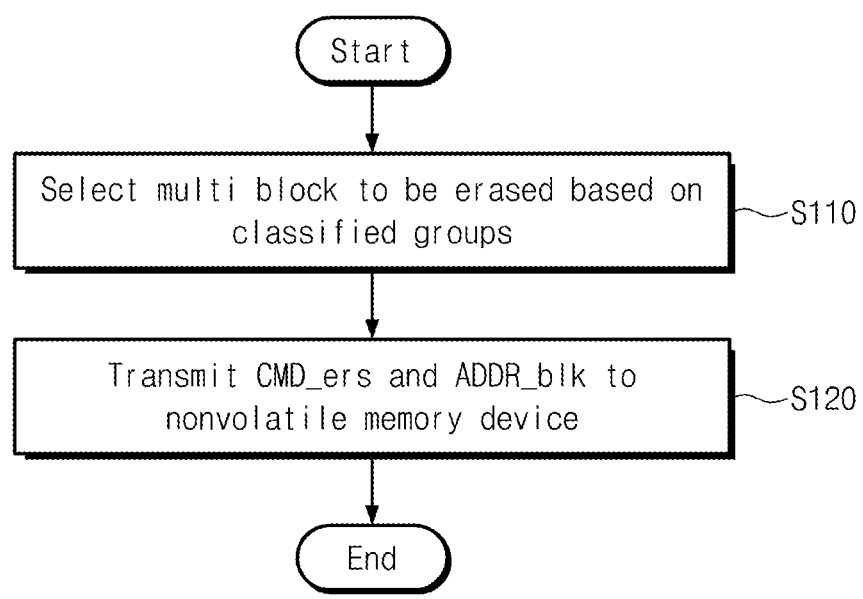
FIG. 6 is a flow chart illustrating an operation of a memory controller illustrated in FIG. 1.

FIG. 6 is a flow chart illustrating an operation of a memory controller illustrated in FIG. 1. Referring to FIGS. 1, 4 and 6, in a step S110, the memory controller 110 may select multi blocks to be erased on the basis of groups classified by the multi block managing unit 111. For example, a plurality of memory blocks BLK11~BLK1n included in the first plane PL1 may be classified into a plurality of groups on the basis of block address coding information. The block address coding information indicates information that a block address is decoded by the address decoder 122 (refer to FIG. 2). The block address coding information is described in detail with reference to FIGS. 7 and 8.

The first to fourth memory blocks BLK11~BLK14 may be classified as a first group according to the block address coding information. The memory controller 110 may erase the first memory block BLK11. At this time, the memory controller 110 may select memory blocks to be erased together with the first memory block BLK11 (that is, to be multi-block erased) among the second to fourth memory blocks BLK12~BLK14 included in the first group.

The memory controller 110 may select memory blocks that are invalid memory blocks among memory blocks included in one group as a multi block. For example, the first group may include first to fourth memory blocks BLK11~BLK14. Each of the first to third memory blocks BLK11~BLK13 may be an invalid memory block. The fourth memory block may be a valid memory block. The memory controller 110 may select the first to third memory blocks BLK11~BLK13 as a multi block.

In a step S120, the memory controller 110 transmits the multi block erase command CMD_ers and the multi block address ADDR_blk to the nonvolatile memory device 120. The multi block address ADDR_blk indicates a block address corresponding to multi blocks selected in the step S110.

The nonvolatile memory device 120 receives the multi block erase command CMD_ers and the multi block address ADDR_blk and may erase memory blocks corresponding to the multi block address ADDR_blk in response to the received multi block erase command CMD_ers. The multi block erase operation is described in detail with reference to FIGS. 10 to 12.

Figure 7:
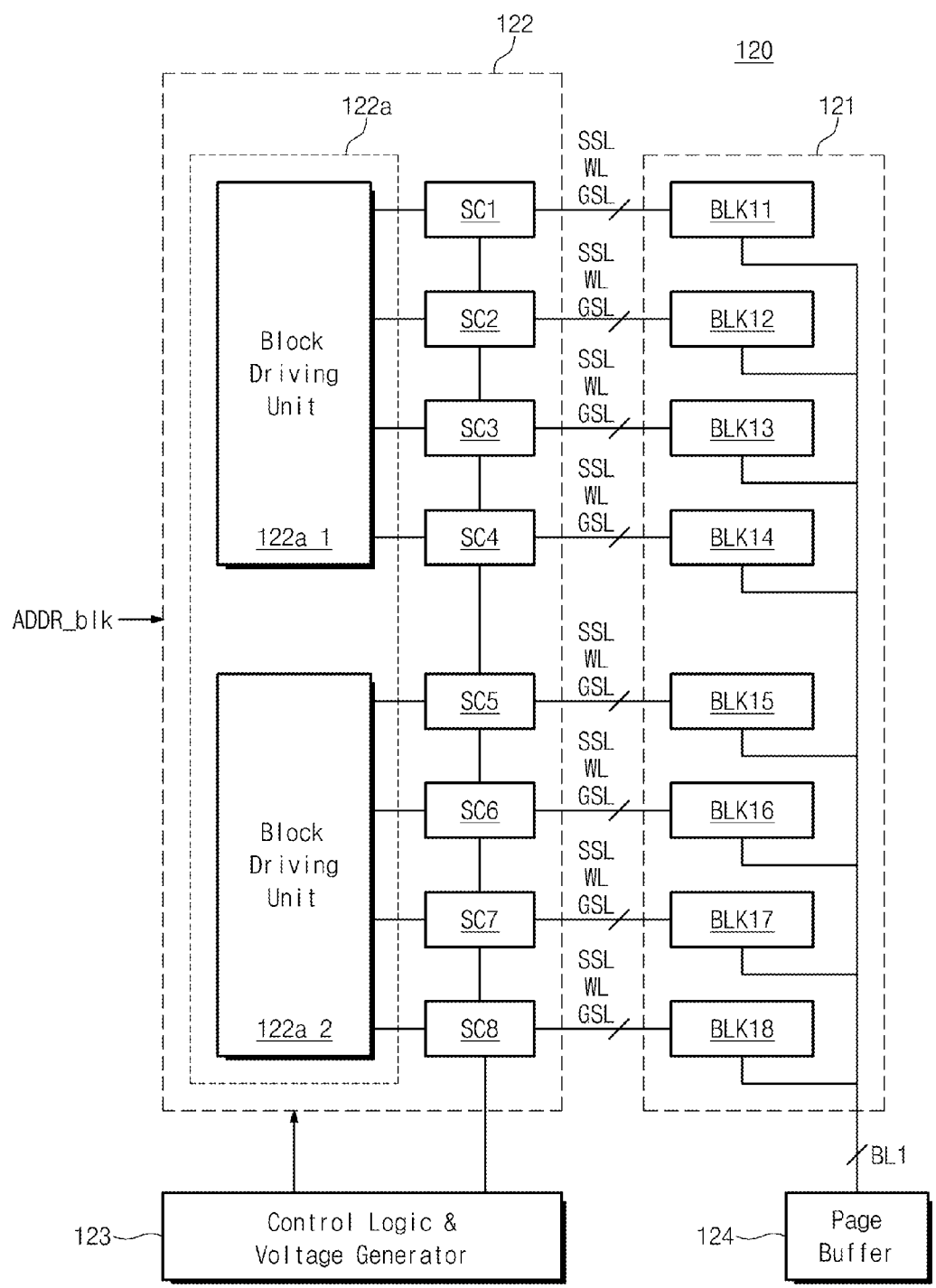
FIG. 7 is a block diagram illustrating a nonvolatile memory device illustrated in FIG. 3.

FIG. 7 is a block diagram illustrating a nonvolatile memory device illustrated in FIG. 3. Block address coding information and a block classification operation of the memory controller are described with reference to FIG. 7. For brevity of description, constituent elements not needed to explain the block address coding information and the block classification operation are omitted.

Referring to FIGS. 3 and 7, the nonvolatile memory device 120 includes the memory cell array 121, the address decoder 122, the control logic & voltage generator 123 and the page buffer 124. The memory cell array 121 includes a plurality of memory blocks BLK11~BLK18. The memory blocks BLK11~BLK18 are connected to the page buffer 124 through a bit line BL1. Each of the memory blocks BLK11~BLK18 may have the same structure as the memory block BLK11 described with reference to FIG. 5.

The address decoder 122 decodes multi block address ADDR_blk received from the memory controller 110 and may select a part of the memory blocks BLK11~BLK18 on the basis of the decoded address. The selected memory blocks may be included in any one of groups.

The address decoder 122 includes the block driver 122a and first to eighth select circuits SC1~SC8. The block driver 122a includes first and second block driving units 122a_1 and 122a_2. The first block driving unit 122a_1 is connected to the first through fourth select circuits SC1~SC4. The first block driving unit 122a_1 may decode the multi block address ADDR_blk to control the first through fourth select circuits SC1~SC4.

For example, if the multi block address ADDR_blk may be an address corresponding to the first through third memory blocks BLK11~BLK13, the first block driving unit 122a_1 may control the first through third select circuits SC1~SC3 so that a voltage being output from the control logic & voltage generator 123 is supplied to a string select line SSL, a word line WL and a ground select line GSL that are connected to the first through third memory blocks BLK11~BLK13.

The second block driving unit 122a_2 is connected to the fifth through eighth select circuits SC5~SC8. The second block driving unit 122a_2 may decode the multi block address ADDR_blk to control the fifth through eighth select circuits SC5~SC8.

The first block driving unit 122a_1 is configured to select the first through fourth memory blocks BLK11~BLK14 and the second block driving unit 122a_2 is configured to select the fifth through eighth memory blocks BLK15~BLK18.

The block address coding information indicates a relation between the block driving unit and a memory block that may be selected by the block driving unit. In example embodiments, the block address coding information may indicate corresponding relation information between block driving units and memory blocks.

That is, according to the block address coding information, the memory controller 110 may classify the first through fourth memory blocks BLK11~BLK14 as a first group and may classify the fifth through eighth memory blocks BLK15~BLK18 as a second group. The first and second block driving units 122a_1 and 122a_2 may be configured to select the first through fourth memory blocks BLK11~BLK14 classified as a first group and the fifth through eighth memory blocks BLK15~BLK18 classified as a second group respectively.

The first and second block driving units 122a_1 and 122a_2 may be supplied with a power supply voltage for activating a block select signal through different lines from each other. For example, the first block driving unit 122a_1 may be supplied with a power supply voltage from the control logic & voltage generator 123 through a first line (not shown). The second block driving unit 122a_2 may be supplied with a power supply voltage from the control logic & voltage generator 123 through a second line (not shown).

The memory controller 110 may classify a plurality of memory blocks into a plurality of groups on the basis of the block address coding information as described with reference to FIG. 7.

Figure 8:
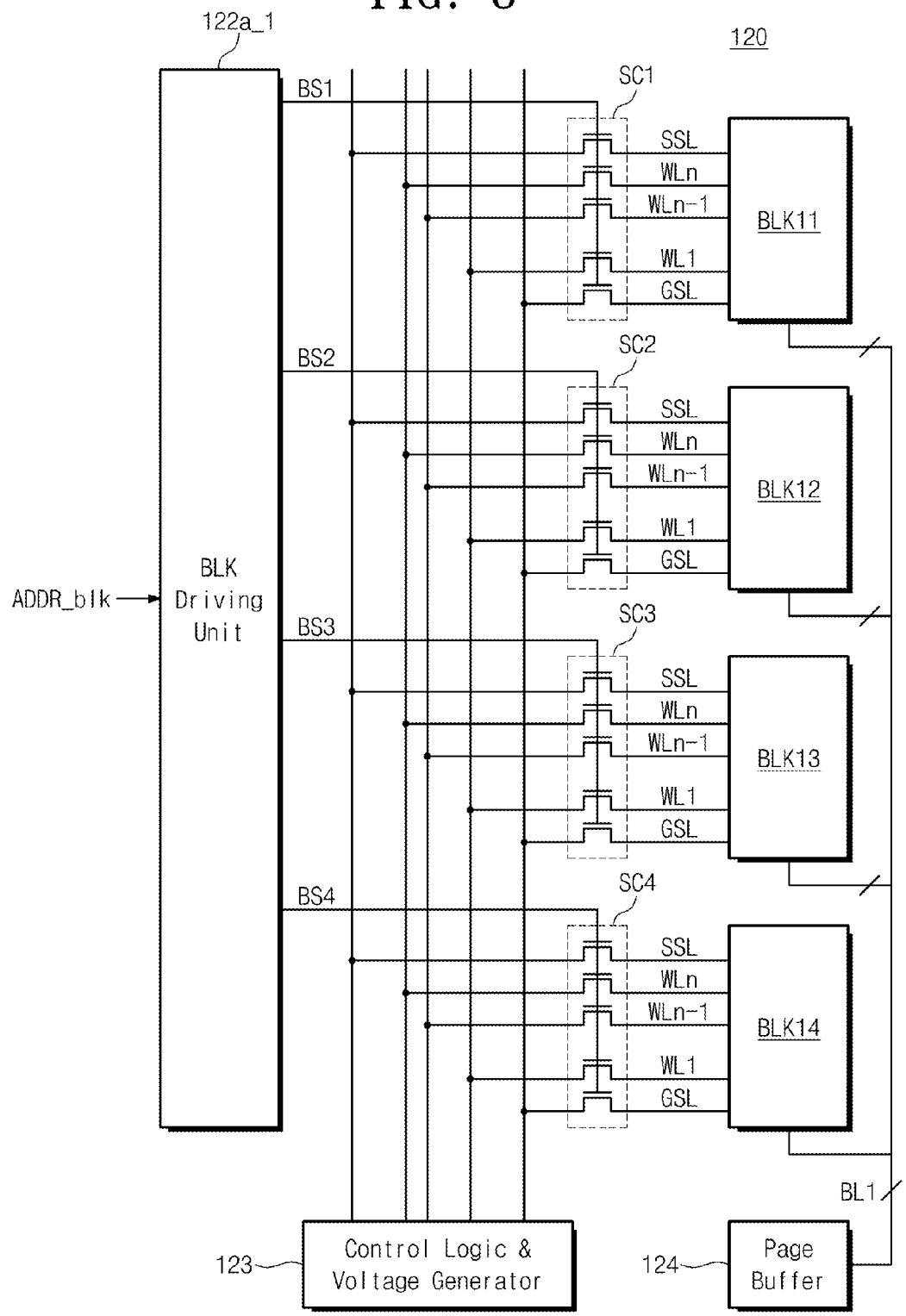
FIG. 8 is a drawing illustrating a nonvolatile memory device illustrated in FIG. 7 in further detail.

FIG. 8 is a drawing illustrating a nonvolatile memory device illustrated in FIG. 7 in further detail. For brevity of drawing, other constituent elements than the first block driving unit 122a_1, the first through fourth select circuits SC1~SC4, the first through fourth memory blocks BLK11~BLK14, the control logic & voltage generator 123 and the page buffer 124 are excepted in FIG. 8.

Referring to FIG. 8, the nonvolatile memory device 120 includes the first block driving unit 122a_1, the first through fourth select circuits SC1~SC4, the first through fourth memory blocks BLK11~BLK14, the control logic & voltage generator 123 and the page buffer 124.

The first through fourth memory blocks BLK11~BLK14 are connected to the respective first through fourth select circuits SC1~SC4 through a string select line SSL, word lines WL1~WLn and a ground select line GSL. The first through fourth memory blocks BLK11~BLK14 are connected to the page buffer 124 through bit lines BL1.

The first through fourth select circuits SC1~SC4 may transmit voltages being output from the control logic & voltage generator 123 to the first through fourth memory blocks BLK11~BLK14 respectively in response to first through fourth block select signals BS1~BS4.

The first block driving unit 122a_1 decodes the multi block address ADDR_blk and may control the first through fourth block select signals BS1~BS4 on the basis of the decoded multi block address. For example, the multi block address ADDR_blk may be an address corresponding to the first and second memory blocks BLK11 and BLK12. In this case, the first block driving unit 122a_1 may decode the multi block address ADDR_blk to activate the first and second block select signals BS1 and BS2. The activated first and second block select signals BS1 and BS2 may be a high voltage. The activated first and second block select signals BS1 and BS2 may also be a turn-on voltage of transistors included in the first and second select circuits SC1 and SC2. Transistors included in the first and second select circuits SC1 and SC2 are turned on in response to the activated first and second block select signals BS1 and BS2.

As described above, the first block driving unit 122a_1 may decode the multi block address ADDR_blk to select a part of the first through fourth memory blocks BLK11~BLK14.

FIG. 9 is a drawing for explaining a relation between a plurality of memory blocks and a plurality of groups. Referring to FIGS. 4 and 9, a plurality of memory blocks (BLK11~BLK18, BLK21~BLK28) may be classified into first through fourth groups GR1~GR4 according to the block address coding information. For example, the first through third memory blocks BLK11~BLK13 included in the first plane PL1 may be classified as the first group GR1 according to the block address coding information. That is, the first through third memory blocks BLK11~BLK13 are connected to one block driving unit.

The fifth through seventh memory blocks BLK15~BLK17 included in the first plane PL1 may be classified as the second group GR2 according to the block address coding information. The first through fourth memory blocks BLK21~BLK24 included in the second plane PL2 may be classified as the third group GR3 according to the block address coding information. The fifth through seventh memory blocks BLK25~BLK27 included in the second plane PL2 may be classified as the fourth group GR4 according to the block address coding information.

A part of memory blocks included in the memory cell array 121 may be determined as bad blocks. In this case, the memory controller 110 may replace the bad blocks with other normal memory blocks. That is, the memory controller 110 replaces a logical address of the bad block with a logical address of the normal memory block so that a read, write or erase operation is performed on the replaced normal memory block when a read, write or erase command of the bad block is given. The memory block replaced due to the bad block does not coincide with the block address coding information with described to FIGS. 7 and 8. As described above, the memory controller 110 may separate the replaced memory blocks from the groups GR1~GR4 to manage them as a single block.

For example, the fourth and eighth blocks BLK14 and BLK18 included in the first plane PL1 and the eighth memory block BLK28 included in the second plane PL2 may be bad blocks. The fourth and eighth memory blocks BLK14 and BLK18 may be replaced with other normal memory blocks BLK19, BLK20 and BLK29. In this case, the memory controller may manage the replaced memory blocks BLK19, BLK20 and BLK29 a single block.

A management of the first through fourth groups GR1~GR4 described above may be performed by the multi block managing unit 111 described with reference to FIG. 2 or may be performed by the processor 113 on the basis of an operation method of the multi block managing unit 111. The single block management described above may be performed by the single block managing unit 112 described with reference to FIG. 2 or may be performed by the processor 113 on the basis of an operation method of the single block managing unit 112.

Information of the first through fourth groups GR1~GR4 and information of the single block may be stored in the SRAM 114 described with reference to FIG. 2.

Figure 10:
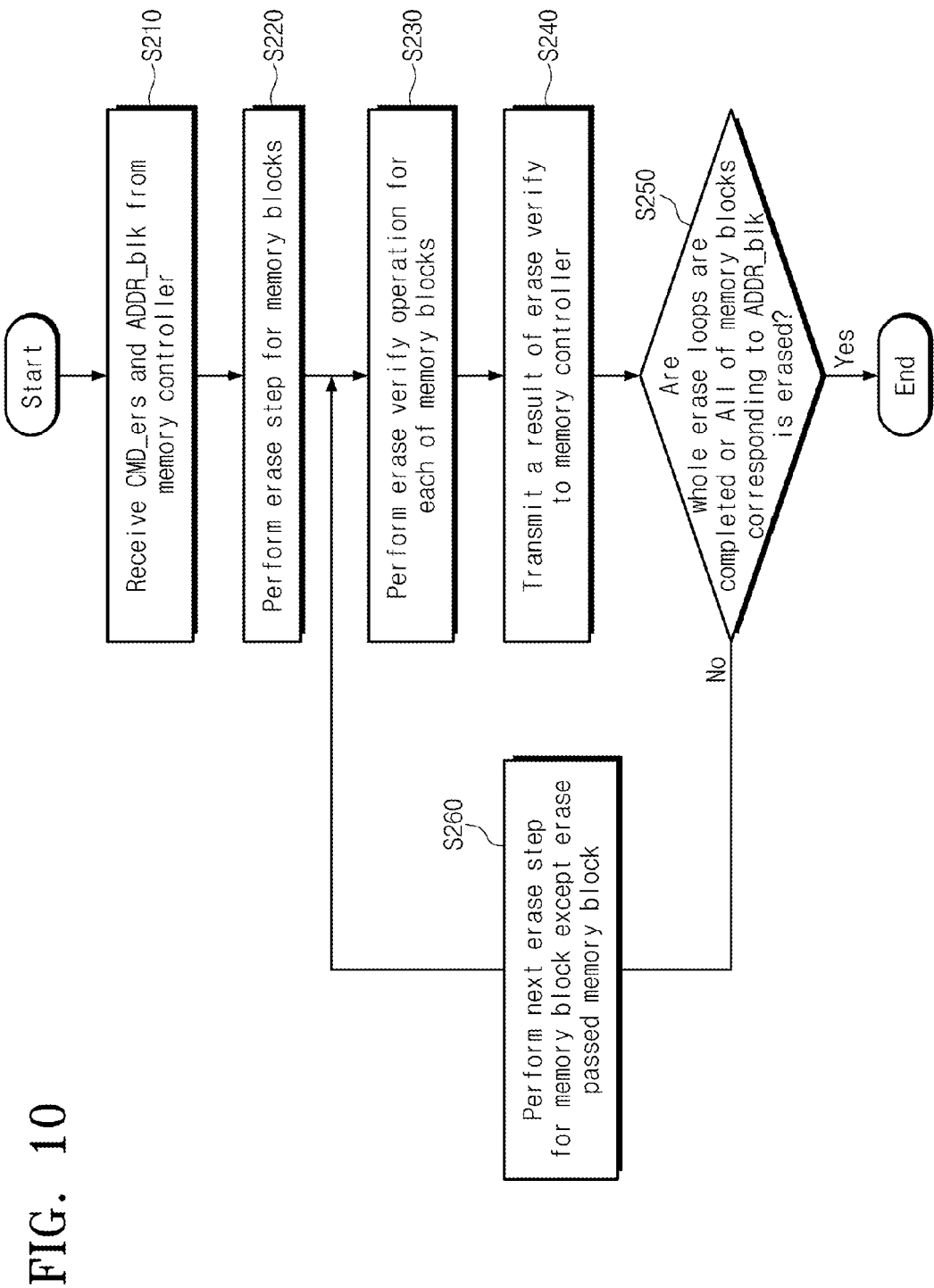
FIG. 10 is a flow chart illustrating a multi block operation of a nonvolatile memory device illustrated in FIG. 3.

FIG. 10 is a flow chart illustrating a multi block operation of a nonvolatile memory device illustrated in FIG. 3. Referring to FIGS. 3 and 10, in a step S210, the nonvolatile memory device 120 may receive a multi block erase command CMD_ers and a multi block address ADDR_blk from the memory controller 110. The multi block address ADDR_blk may include block addresses with respect to a part of memory blocks.

In a step S220, the nonvolatile memory device 120 may perform an erase operation. For example, the nonvolatile memory device 120 may perform an erase operation on at least two memory blocks corresponding to the multi block address ADDR_blk in response to the multi block erase command CMD_ers. The erase operation indicates an operation of applying an erase voltage Vers to a substrate of the memory cell array 121.

In a step S230, the nonvolatile memory device 120 may perform an erase verify operation on each of the memory blocks. For example, after finishing an erase operation, the nonvolatile memory device 120 may sequentially perform an erase verify operation on each of memory blocks corresponding to the multi block address ADDR_blk.

In a step S240, the nonvolatile memory device 120 may transmit an erase verify result to the memory controller 110. The nonvolatile may transmit an erase verify result EV with respect to memory blocks that are being multi-block erased to the memory controller 110 before a multi block erase operation is finished.

In a step S250, the nonvolatile memory device 120 may distinguish whether erase loops are all completed or whether memory blocks corresponding to the multi block address ADDR_blk are all erased. The erase loop includes an erase step of applying an erase voltage Vers to the memory cell array 121 to erase a multi block and an erase verify step for verifying an erase state of a multi block. An erase operation is performed through a plurality of erase loops.

In the case that the erase loops are not all completed and the memory blocks corresponding to the multi block address ADDR_blk are not all erased, in a step S260, the nonvolatile memory device 120 may perform a next erase step on the remaining memory blocks except erase passed memory blocks. For example, the nonvolatile memory device 120 may perform a multi block erase operation by performing a plurality of erase loops. The nonvolatile memory device 120 may perform a next erase step on the remaining memory blocks except memory blocks that are erase-passed according to the step S230 among memory blocks corresponding to the multi block address ADDR_blk. The next erase step may indicate a step of applying an erase voltage Vers higher than the erase voltage Vers being applied in the erase operation of the step S220.

After the step S260, the nonvolatile memory device 120 may perform the step S230 again.

In the case that the erase loops are all completed and the memory blocks corresponding to the multi block address ADDR_blk are all erased, the nonvolatile memory device 120 may finish an erase operation.

Figure 11:
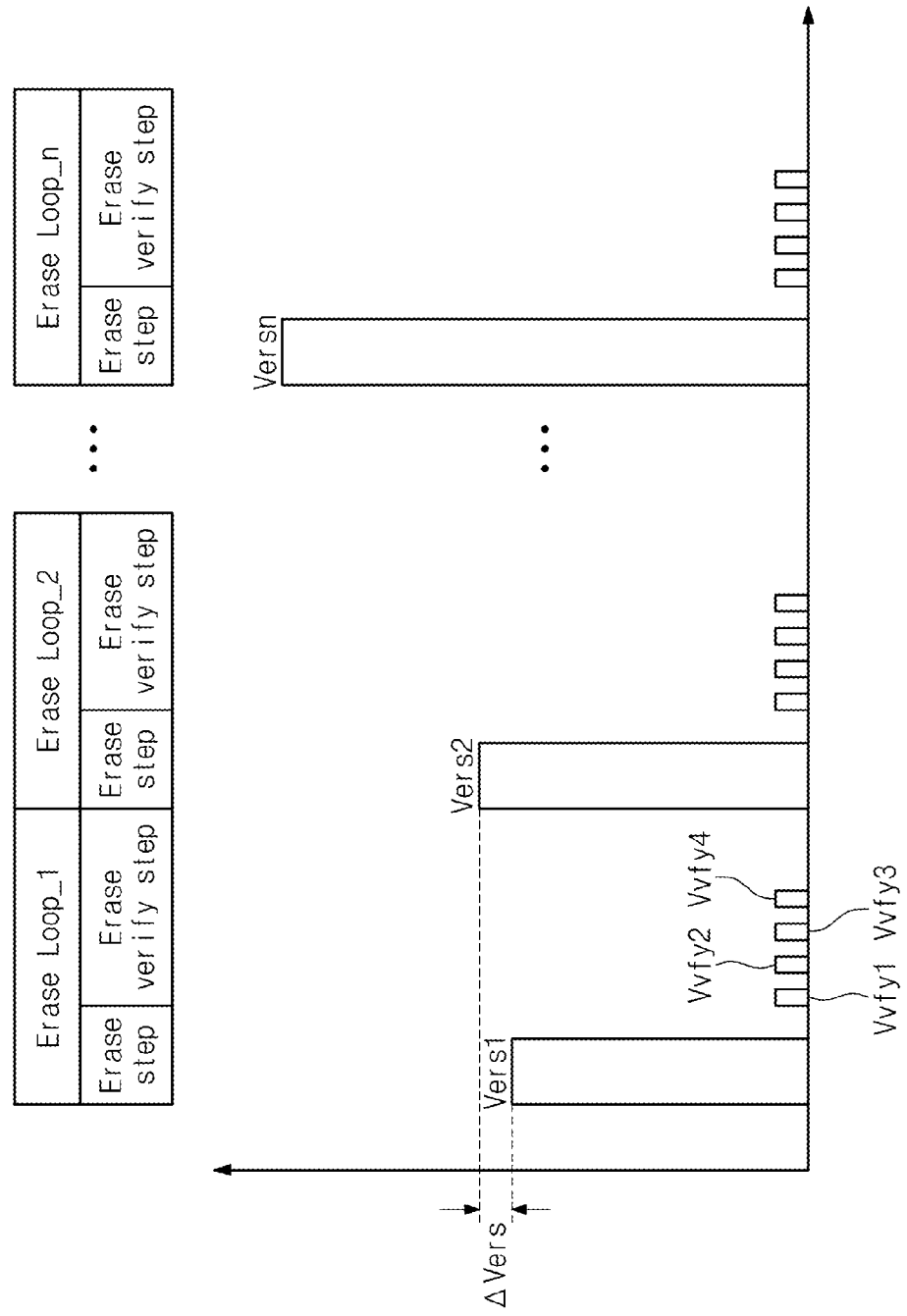
FIG. 11 is a drawing for explaining a multi-block erase operation illustrated in FIG. 10.

FIG. 11 is a drawing for explaining a multi-block erase operation illustrated in FIG. 10. For brevity of description, it is assumed that the nonvolatile memory device 120 performs a multi-block erase operation on the first through fourth memory blocks BLK11~BLK14. However, example embodiments of inventive concepts are not limited thereto.

Referring to FIGS. 3, 4, 10 and 11, the nonvolatile memory device 120 may perform a multi-block erase operation on the first through fourth memory blocks BLK11~BLK14 included in the first plane PL1.

The multi-block erase operation may include a plurality of erase loops Erase Loop_1~Erase Loop_n. Each of the erase loops Erase loop_1~Erase Loop_n includes an erase step and an erase verify step. For example, a first erase voltage Vers1 may be applied in an erase step included in the first erase loop Erase Loop_1. The first erase voltage Vers1 may be an erase starting voltage. The first erase voltage Vers1 may be supplied to a substrate of the memory cell array 121 (refer to the step S230 of FIG. 10).

After that, in an erase verify step included in the first erase loop Erase Loop_1, first through fourth erase verify voltages Vvfy1, Vvfy 2, Vvfy3 and Vvfy4 may be applied. The first through fourth erase verify voltages Vvfy1, Vvfy 2, Vvfy3 and Vvfy4 may be sequentially applied to word lines connected to first through fourth memory blocks BLK11~BLK14 respectively. For example, the first erase verify voltage Vvfy1 may be applied to word lines connected to the first memory block BLK11. In the case that memory cells included in the first memory block BLK11 are all in erase state (that is, the first memory block BLK11 is completely erased), the memory cells included in the first memory block BLK11 are all turned on. The nonvolatile memory device 120 may detect a turned-on memory cell by applying the first erase verify voltage Vvfy1 to word lines connected to the first memory block BLK11. In the case that the memory cells included in the first memory block BLK11 are all turned on, the nonvolatile memory device 120 judges that the first memory block BLK11 is completely erased (refer to the step S240 of FIG. 10).

In the case that at least one of memory cells included in the first memory block BLK11 is not in an erase state (that is, an erase of the first memory block BLK11 is not completed), memory cells that are not in an erase state are turned off. In the case that a turned-off cell is detected among the memory cells of the first memory block BLK11, the nonvolatile memory device 120 judges that the first memory block BLK11 is not completely erased.

The nonvolatile memory device 120 sequentially applies the second through fourth erase verify voltages Vvfy2, Vvfy3 and Vvfy4 to word lines connected to the second through fourth memory blocks BLK12~BLK14 and may verify an erase state of the second through fourth erase verify voltages Vvfy 2, Vvfy3 and Vvfy4 according to the method described above. The nonvolatile memory device 120 may transmit the erase verify result EV to the memory controller 110.

After that, the nonvolatile memory device 120 may perform a second erase loop Erase Loop_2. In an erase step of the second erase loop Erase Loop_2, the nonvolatile memory device 120 may supply a second erase voltage Vers2 to a substrate. The second erase voltage Vers2 may be higher than the first erase voltage Vers1 by ΔVers. After that, the nonvolatile memory device 120 may perform the verify operation described above again.

An erase of any one of the first through fourth memory blocks BLK11~BLK14 may be completed while the erase loops Erase Loop_1~Erase Loop_n are performed. For example, after the third erase loop Erase Loop_3 is performed, the first memory block BLK11 may be completely erased. In this case, while the fourth through nth erase loops Erase Loop_4~Erase Loop_n are performed, the first memory block BLK11 is erase-inhibited. In erase verify steps of the fourth through nth erase loops Erase Loop_4~Erase Loop_n, the first erase verify voltage Vvfy1 may not be applied. That is, the different number of times of erase loops may be applied to each of multi block by omitting erase inhibit and erase verify steps of erase complete memory blocks.

Figure 12:
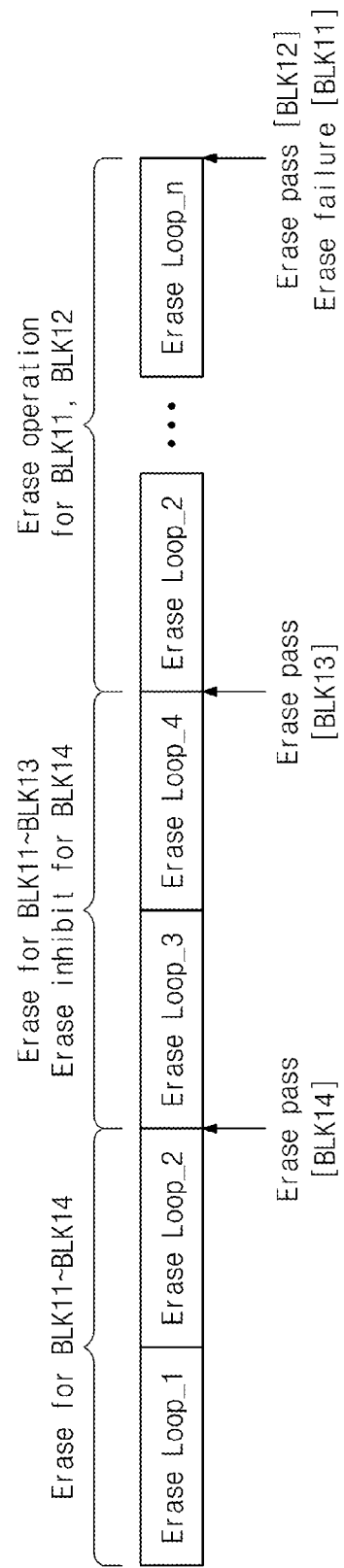
FIG. 12 is a drawing for explaining a plurality of erase loops illustrated in FIG. 11 in detail.

FIG. 12 is a drawing for explaining a plurality of erase loops illustrated in FIG. 11 in detail. Referring to FIGS. 11 and 12, the nonvolatile memory device 120 may perform a multi block erase operation on the first through fourth memory blocks BLK11~BLK14. For example, the nonvolatile memory device 120 may erase the first through fourth memory blocks BLK11~BLK14 by performing the fourth through nth erase loops Erase Loop_4~Erase Loop_n. At this time, the nonvolatile memory device 120 may erase the first through fourth memory blocks BLK11~BLK14 during the first and second erase loops Erase Loop_1 and Erase Loop_2. In a verify step included in the second erase loop Erase Loop_2, it may be judged that the fourth memory block BLK14 is completely erased.

After that, the nonvolatile memory device 120 may perform the third and fourth erase loops Erase Loop_3 and Erase Loop_4 on the first through third memory blocks BLK11~BLK13. That is, the fourth memory block BLK14 that are completely erased is erase-inhibited. The nonvolatile memory device 120 may transmit an erase verify result EV to the memory controller 110 while performing the third erase loop Erase Loop_3.

In a verify step included in the fourth erase loop Erase Loop_4, it may be judged that the third memory block BLK13 is completely erased. After that, the nonvolatile memory device 120 may perform the fifth through nth erase loops Erase Loop_5~Erase Loop_n. That is, the third and fourth memory blocks BLK13 and BLK14 that are completely erased are erase-inhibited. In a verify step included in the nth erase loop Erase Loop_n, it may be judged that the second memory block BLK12 is completely erased.

After that, since the nonvolatile memory device 120 performs all the erase loops, it may transmit erase fail information of the first memory block BLK11 to the memory controller 110.

The nonvolatile memory device 120 may transmit an erase verify result to the memory controller 110 every time each erase loop is performed. The nonvolatile memory device 120 may also transmit an erase verify result to the memory controller 110 every time the desired (and/or alternatively predetermined) number of times of erase loops is performed. The nonvolatile memory device 120 may also transmit an erase verify result to the memory controller 110 every time a memory block that is completely erased is detected. The nonvolatile memory device 120 may transmit an erase verify result to the memory controller 110 while performing a plurality of erase loops.

Figure 13:
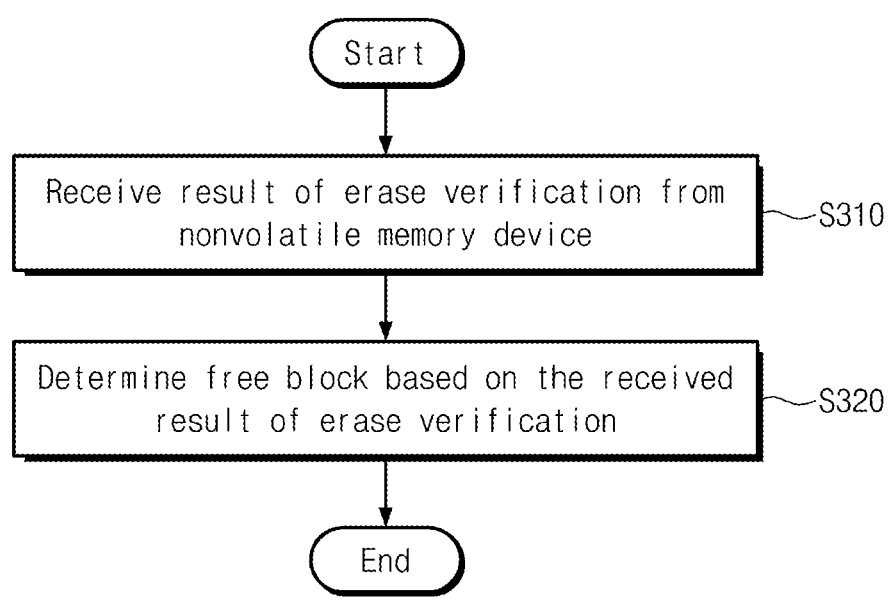
FIG. 13 is a flow chart illustrating another operation of a memory controller according to example embodiments of inventive concepts.

FIG. 13 is a flow chart illustrating another operation of a memory controller according to example embodiments of inventive concepts. Referring to FIGS. 2 and 13, in a step S310, the memory controller 110 receives an erase verify result from the nonvolatile memory device 120. For example, in the step S240 of FIG. 10, the nonvolatile memory device 120 transmits an erase verify result EV to the memory controller 110. The memory controller 110 may receive an erase verify result EV from the nonvolatile memory device 120. The erase verify result EV may include an erase verify result of each of at least two memory blocks included in the multi block. The nonvolatile memory device 120 may transmit the erase verify result EV to the memory controller 110 while performing a plurality of erase loops.

In a step S320, the memory controller 110 may determine a free block on the basis of the received erase verify result EV. For example, the received erase verify result EV may include information of an erase complete memory block among memory blocks included in the multi block. In this case, the memory controller 110 may determine the erase complete memory block as a free block. After that, the memory controller 110 may perform a write operation on memory blocks determined to be a free block.

While the nonvolatile memory device 120 performs an erase operation, a program request having a high priority may be received from an external device (e.g., a host, an application processor). In this case, the memory controller 110 may suspend a multi block erase operation of the nonvolatile memory device 120 and may perform a program operation having a high priority. At this time, the memory controller 110 may assign a memory block determined to be a free block to a write memory block.

Figure 14:
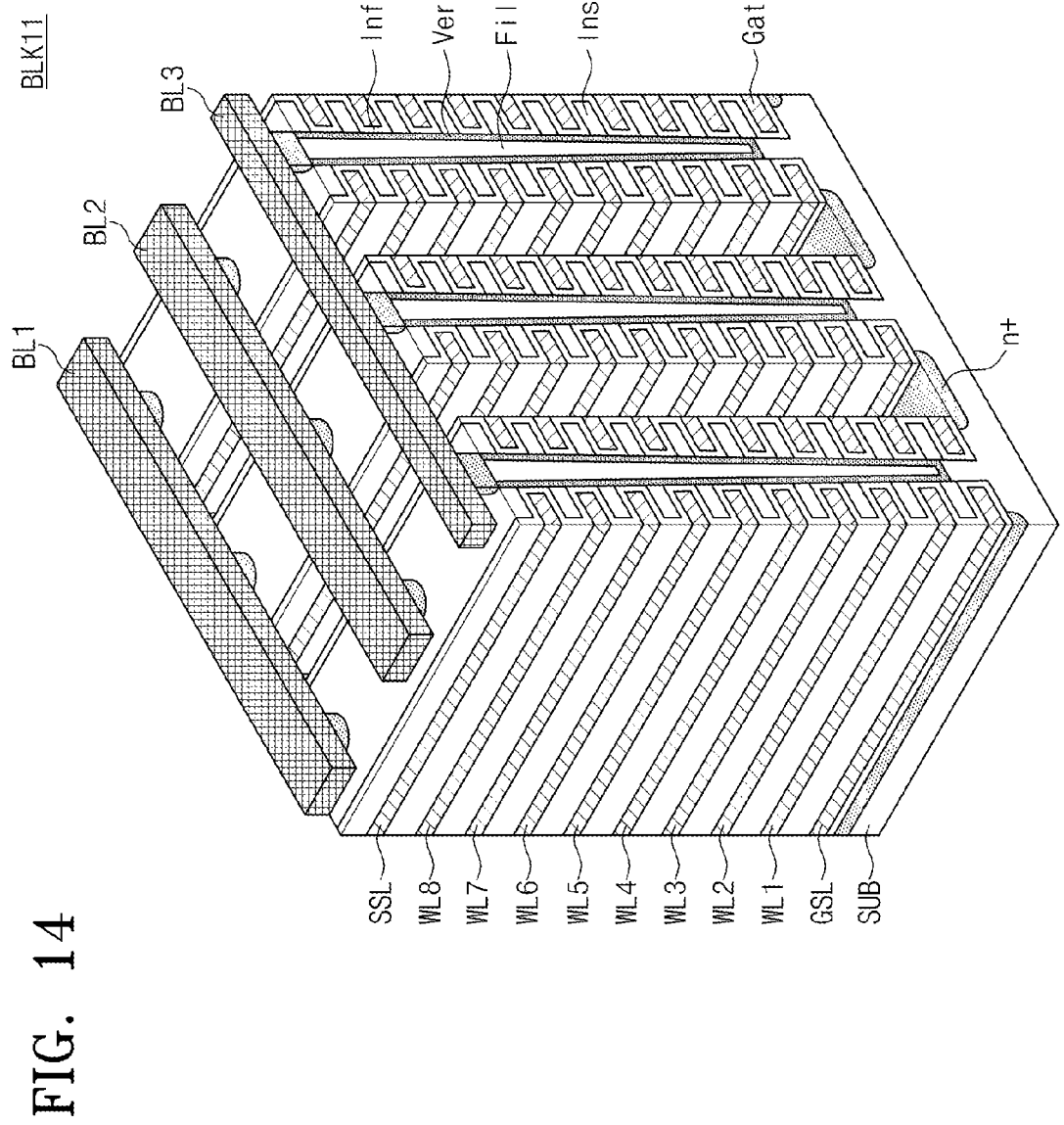
FIG. 14 is a perspective view illustrating a three-dimensional structure of a first memory block among a plurality of memory blocks illustrated in FIG. 5.

FIG. 14 is a perspective view illustrating a three-dimensional structure of a first memory block among a plurality of memory blocks illustrated in FIG. 5.

Referring to FIG. 14, the memory block BLK11 includes a gate electrode layer, an insulation layer, a vertical active pattern, and a charge storage layer. The memory block BLK1 is formed in a direction perpendicular to a substrate SUB. An n+ doping region is formed in the substrate SUB. The gate electrode layer and the insulation layer are alternately deposited on the substrate SUB. The charge storage layer may be formed between the gate electrode layer and the insulation layer.

If the gate electrode layer and the insulation layer are patterned along a vertical direction, a pillar having a V character shape is formed. The pillar is connected to the substrate SUB through the gate electrode layer and the insulation layer. An external part of the pillar may be constituted by a channel semiconductor and an internal part of the pillar may be constituted by an insulation material such as a silicon oxide.

Referring to FIG. 14, the gate electrode layer of the memory block BLK11 may be connected to a ground select line GSL, a plurality of word lines WL1~WL8 and a string select line SSL. The pillar of the memory block BLK11 may form a plurality of bit lines BL1~BL3. In FIG. 14, one memory block BLK11 has 2 select lines GSL and SSL, 8 word lines WL1~WL8 and 3 bit lines BL1~BL3, but example embodiments are not limited to this example. For example, each the number of word lines WL1~WL8 stacked on each other between the select lines GSL and SSL may be different than 8 word lines. Also, a memory block may include a plurality of string select lines SSL and/or ground select lines GSL.

Figure 15:
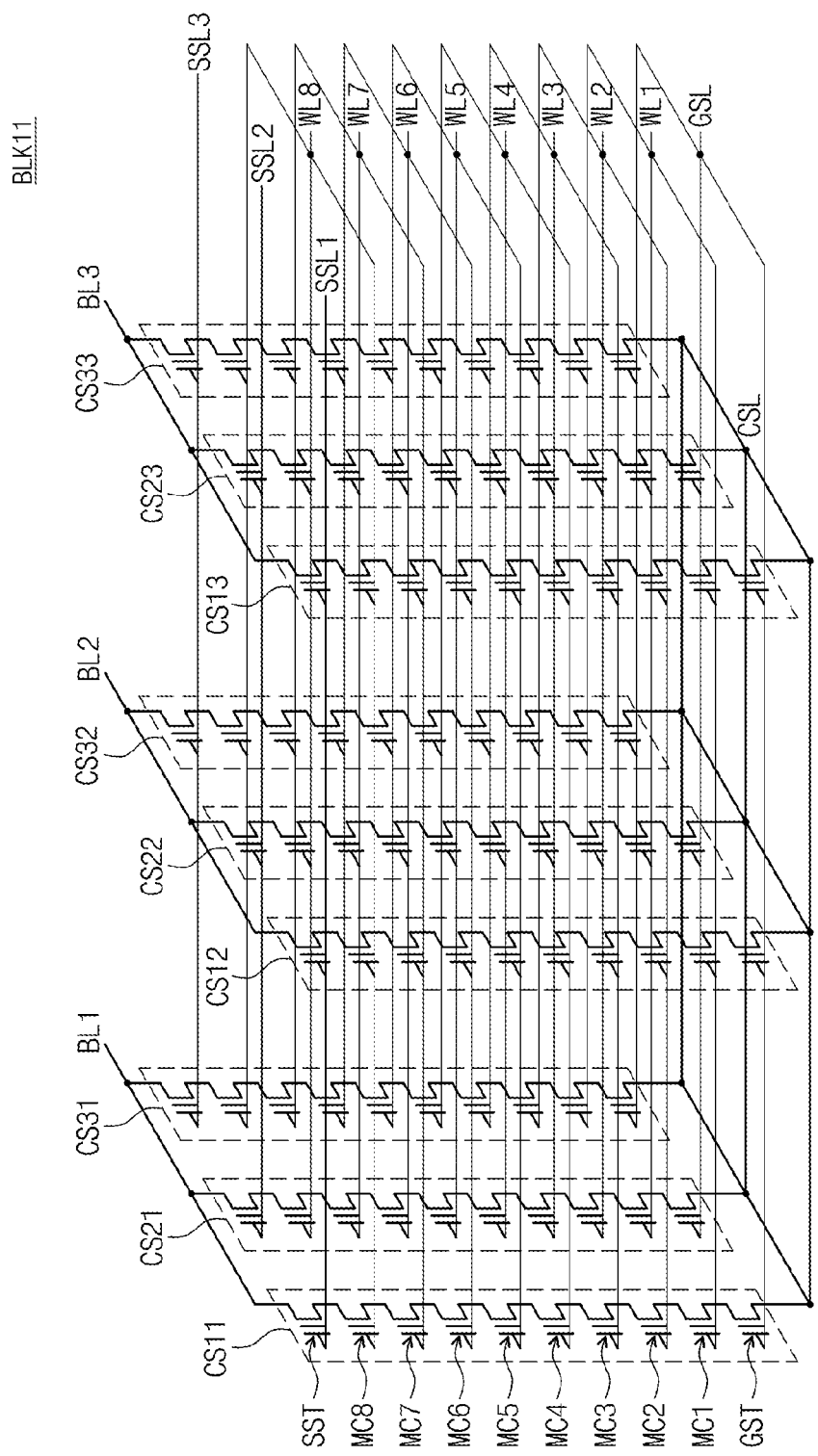
FIG. 15 is an equivalent circuit of a memory block illustrated in FIG. 14.

FIG. 15 is an equivalent circuit of a memory block illustrated in FIG. 14. Referring to FIG. 15, cell strings CS11~CS33 may be connected between the bit lines BL1~BL3 and a common source CSL. Each cell string (e.g., CS11) includes a string select transistor SST, a plurality of memory cells MC1~MC8 and a ground select transistor GST.

The string select transistors SST is connected to the string select line SSL (SSL1~SSL3). The memory cells MC1~MC8 are connected to the respective word lines WL1~WL8. The ground select transistor GST is connected to the ground select line GSL. The string select transistor SST is connected to the bit line BL and the ground select transistor GST is connected to the common source line CSL.

The word line having the same height (e.g., WL1) is connected in common and the string select lines SSL1~SSL3 are separated from one another. In the case of programming memory cells (hereinafter it is referred to as 'page') that are connected to the first word line WL1 and belong to the cell strings CS11, CS12 and CS13, the first word line WL1 and the first select line SSL1 are selected.

The nonvolatile memory device having a memory cell array having a three dimensional structure described with reference to FIGS. 14 and 15 may operate based on the operation method described with reference to FIGS. 1 through 13.

In an embodiment of the present inventive concept, a three dimensional (3D) memory array is provided. The 3D memory array may be included in the nonvolatile memory device or the memory cell array of the nonvolatile memory device. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string further may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 16:
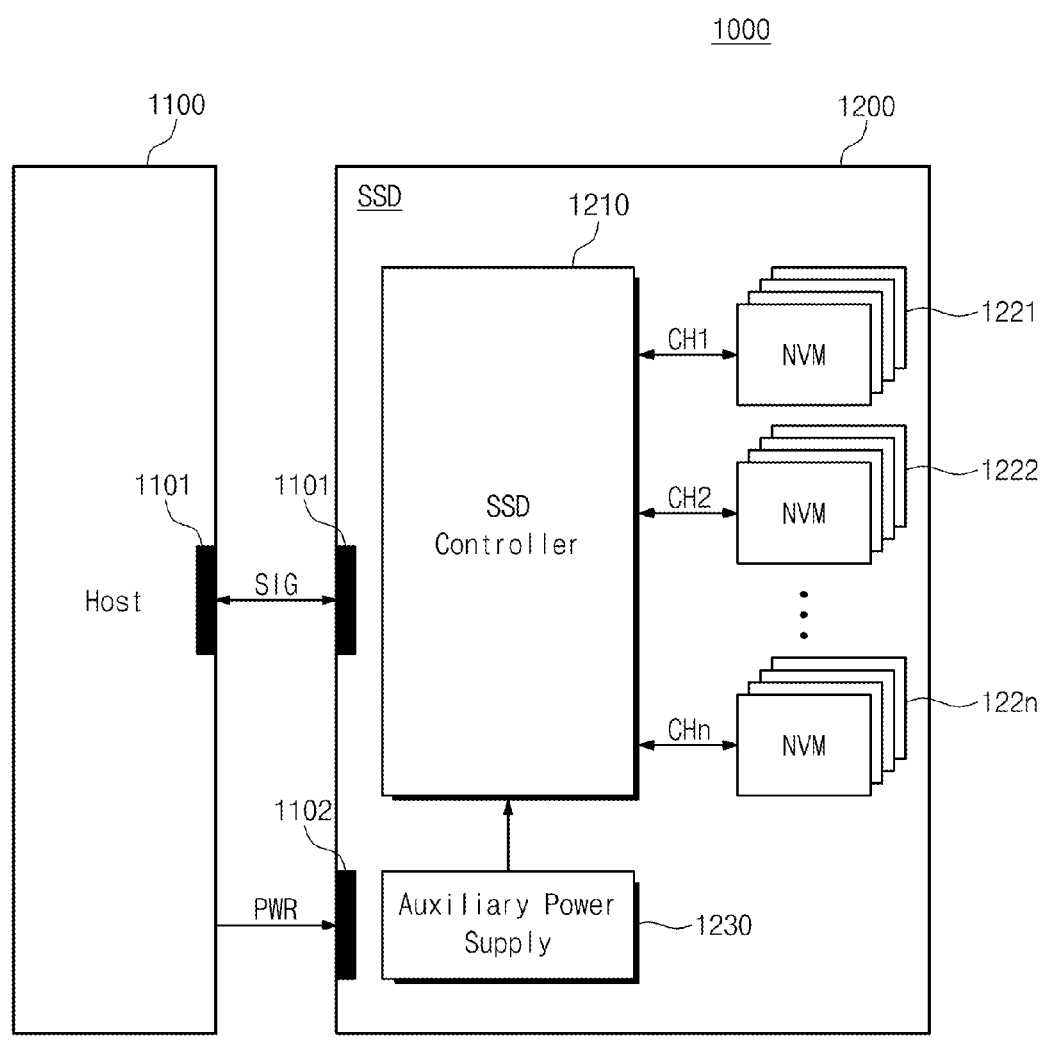
FIG. 16 is a block diagram illustrating a solid state drive SSD system to which a nonvolatile memory device according to example embodiments of inventive concepts is applied.

FIG. 16 is a block diagram illustrating a solid state drive SSD system to which a nonvolatile memory device according to example embodiments of inventive concepts is applied. Referring to FIG. 16, the SSD system includes a host 1100 and a SSD 1200. The SSD 1200 may be a memory card.

The host 1100 writes data in the SSD 1200 or reads data stored in the SSD 1200. The host 1100 may exchange a signal SIG such as a command, an address and state information with the SSD 1200 through a host interface 1101. The host interface 1101 may include various interfaces such as a USB (universal serial bus), a MMC (multimedia card), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), a MIPI (mobile industry processor interface), etc.

The SSD 1200 exchanges a signal SIG with the host 1100 through the host interface 1101 and is inputted with power through a power connector 1102. The SSD 1200 may include a plurality of nonvolatile memories 1221~122n, a SSD controller 1210 and an auxiliary power supply 1230. The nonvolatile memories 1221~122n may be embodied by a PRAM, a MRAM, an ReRAM, a FRAM, etc. besides a NAND flash memory.

The nonvolatile memories 1221~122n are used as a storage medium of the SSD 1200. The nonvolatile memories 1221~122n may be connected to the SSD controller 1210 through a plurality of channels CH1~CHn. One or more nonvolatile memories may be connected to each channel. Nonvolatile memories connected to each channel may be connected to the same data bus.

The SSD controller 1210 exchanges a signal SGL with the host 1100 through the host interface 1201. The signal SGL includes a command, an address, data, etc. The SSD controller 1210 writes data in a corresponding nonvolatile memory or reads data from the corresponding nonvolatile memory according to a command of the host 1100.

The auxiliary power supply 1230 is connected to the host 1100 through the power connector 1202. The auxiliary power supply 1230 may receive power from the host 1100 to charge it. The auxiliary power supply 1230 may be located inside or outside the SSD 1200. For example, the auxiliary power supply 1230 is located on a main board and may provide auxiliary power to the SSD 1200.

Each of the nonvolatile memory devices 1221~122n may be the nonvolatile memory device described with reference to FIGS. 1 through 7. That is, each of the nonvolatile memory devices 1221~122n includes a plurality of memory blocks and may perform an erase operation on the basis of a multi erase method described with reference to FIGS. 10 through 13. The SSD controller 1210 may operate based on the operation method described with reference to FIGS. 1 through 14 or may control the nonvolatile memory devices 1221~122n.

Figure 17:
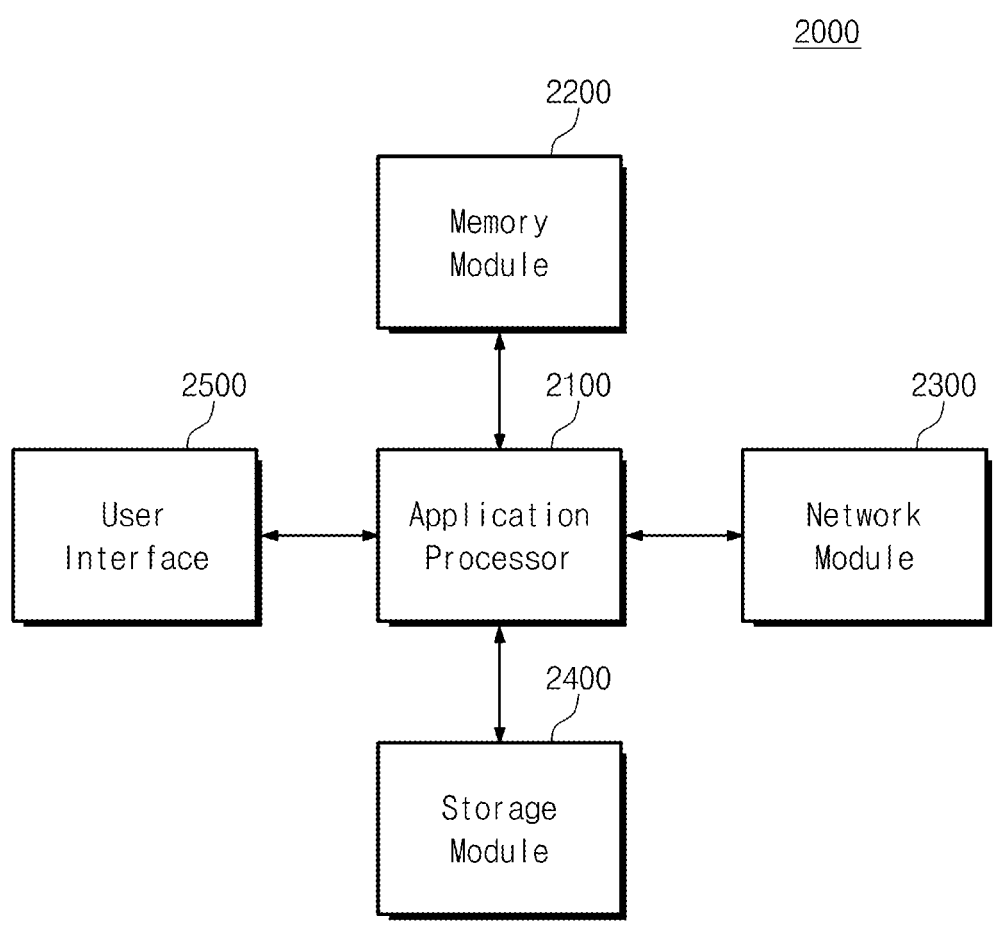
FIG. 17 is a block diagram illustrating a user system to which a memory system according to example embodiments of inventive concepts is applied.

FIG. 17 is a block diagram illustrating a user system to which a memory system according to example embodiments of inventive concepts is applied. Referring to FIG. 17, a user system 2000 includes an application processor 2100, a memory module 2200, a network module 2300, a storage module 2400 and a user interface 2500. The user system 2000 may be provided as one of computing systems such as an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a digital audio recorder, a digital audio player, a digital picture recorder, a digital picture player, a digital video recorder, a digital video player, etc.

The application processor 2100 may drive constituent elements and an operating system OS that are included in the user system 2000. The application processor 2100 may include controllers controlling constituent elements included in the user system 2000, a graphic engine, and various interfaces.

The memory module 2200 may operate as a main memory, an operation memory, a buffer memory or a cache memory. The memory module 2200 may include a volatile random access memory such as DRAM, SDRAM, DDR SDRAM, DDR2 SDRAM, DDR3 SDRAM, LPDDR DRAM, LPDDR2 DRAM, LPDDR3 DRAM, etc. and a nonvolatile random access memory such as PRAM, ReRAM, MRAM, FRAM, etc.

The network module 2300 may perform a communication with external devices. The network module 2300 may support a wireless communication such as a CDMA (code division multiple access), a GSM (global system for mobile communication), a WCDMA (wideband CDMA), a CDMA-2000, a TDMA (time division multiple access), a LTE (long term evolution), a Wimax, a WLAN, a UWB, a blue tooth, a WI-DI, etc.

The storage module 2400 may store data. For example, the storage module 2400 may store data received from the outside. The storage module 2400 may transmit data stored in the storage module 2400 to the application processor 2100. The storage module 2400 may be embodied by a semiconductor memory device such as a PRAM, a MRAM, a RRAM, a NAND flash, a NOR flash, a three-dimensional NAND flash, etc. The storage module 2400 may include a plurality of nonvolatile memory devices. The nonvolatile memory devices may be the nonvolatile memory device described with reference to FIGS. 1 through 13. The storage module 2400 may include the memory controller described with reference to FIGS. 1 through 13. That is, the storage module 2400 may perform an erase operation on the basis of the multi block erase method described with reference to FIGS. 1 through 13.

The user interface 2500 may include interfaces that input data or a command to the user system 2100 or output data to an external device. The user interface 2500 may include input devices such as a camera, a touch screen, an operation recognition module, a mike or output devices such as a display, a speaker, a touch screen, etc.

According to example embodiments of inventive concepts, a nonvolatile memory system includes a memory controller and a nonvolatile memory device. The memory controller may classify a plurality of memory blocks included in one plane into a plurality of groups on the basis of block address coding information. The memory controller may select at least two memory blocks (that is, multi block) among the memory blocks included in one plane to perform a multi block erase operation on the basis of the classified groups. The nonvolatile memory device may erase a multi block together according to a control of the memory controller. Thus, since a plurality of memory blocks may be erased at the same time, a nonvolatile memory device having improved performance and a nonvolatile memory system including the same are provided.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A nonvolatile memory system comprising:
   a nonvolatile memory device including a plurality of planes, each of the planes including a plurality of memory blocks; and
   a memory controller configured to classify the memory blocks of each of the planes into a plurality of groups, respectively, select at least two of the plurality of memory blocks in one of the plurality of groups, and control the nonvolatile memory device so the selected at least two memory blocks are multi-block erased,
   wherein each of the plurality of memory blocks includes a plurality of cell strings, and each cell string includes a plurality of memory cells stacked on top of each other between a ground select transistor and a string select transistor.

2. The nonvolatile memory system of claim 1, wherein the memory controller further includes,
   a multi block managing unit configured to classify the plurality of memory blocks into the plurality of groups; and
   a single block managing unit configured to manage memory blocks that are not classified into the groups among the plurality of memory blocks in each of the planes.

3. The nonvolatile memory system of claim 2, wherein the multi block managing unit is configured to select the at least two memory blocks in the one of the plurality of the groups.

4. The nonvolatile memory system of claim 1, wherein the memory controller is configured to transmit a multi block erase command and a multi block address of the at least two memory blocks to the nonvolatile memory device.

5. The nonvolatile memory system of claim 4, wherein the nonvolatile memory device is configured to perform a multi block erase operation on the at least two memory blocks in response to the multi block erase command.

6. The nonvolatile memory system of claim 5, wherein the multi block erase operation includes a plurality of erase loops, and
   wherein each of the erase loops includes
      applying an erase voltage to a substrate of the at least two memory blocks, and verifying an erase state of each of the at least two memory blocks.

7. The nonvolatile memory system of claim 6, wherein the nonvolatile memory device is configured to transmit an erase verify result to the memory controller while performing the multi block erase operation, based on the verification.

8. The nonvolatile memory system of claim 7, wherein the memory controller is configured to set a memory block that is completely erased among the at least two memory blocks to a free memory block on the basis of the erase verify result.

9. The nonvolatile memory system of claim 4, wherein the nonvolatile memory device includes an address decoder,
wherein the address decoder includes a plurality of block driving units connected to the memory blocks, configured to decode the multi block address and select memory blocks corresponding to the multi block address among the plurality of memory blocks, and
wherein the memory controller is configured to classify the plurality of memory blocks into the plurality of groups on the basis of coding information of the address decoder indicating corresponding relationship information between the plurality of block driving units and the plurality of memory blocks.

10. The nonvolatile memory system of claim 1, wherein each of the plurality of memory blocks comprises a non-volatile memory that is monolithically formed in one or more physical levels of memory cells having active areas disposed above a silicon substrate.

11. The nonvolatile memory system of claim 1, wherein the memory blocks included in each of the planes share a bit line.

12. An method of operating a nonvolatile memory system including a nonvolatile memory device and a memory controller configured to control the nonvolatile memory device, the nonvolatile memory device including a plurality of memory blocks, the method comprising:
classifying the plurality of memory blocks into a plurality of groups using the memory controller,
selecting at least two memory blocks in one of the plurality of groups using the memory controller;
transmitting a multi block address and a multi block erase command using the memory controller to the nonvolatile memory device on the basis of the selected at least two memory blocks; and
performing a multi block erase operation on memory blocks corresponding to the multi block address in response to the nonvolatile memory device receiving the multi block erase command,
wherein each of the plurality of memory blocks includes a plurality of cell strings, and each cell string includes a plurality of memory cells stacked on top of each other between a ground select transistor and a string select transistor.

13. The method of claim 12, wherein the selecting at least two memory blocks in one of the plurality of groups includes
selecting the at least two memory blocks from a same group among the plurality of groups; and
selecting the at least two memory blocks from memory blocks having an invalid state among the memory blocks in the same group.

14. The method of claim 12, further comprising:
transmitting an erase verify result of the multi block erase operation to the memory controller before the multi block erase operation is completed.

15. The method of claim 14, further comprising:
setting a memory block that is completely erased among the at least two memory blocks to a free block on the basis of the received erase verify result using the memory controller.

16. A nonvolatile memory system comprising:
a nonvolatile memory device including a plurality of planes, each of the planes including a plurality of memory blocks; and
a memory controller configured to designate at least two memory blocks in a same plane among the plurality of planes as a multi block, and control the nonvolatile memory device so that at least two memory blocks of the multi block are erased during a multi block erase operation,
wherein each of the plurality of memory blocks includes a plurality of cell strings, and each cell string includes a plurality of memory cells stacked on top of each other between a ground select transistor and a string select transistor.

17. The nonvolatile memory system of claim 16, wherein the nonvolatile memory device includes an address decoder including a plurality of block driving units connected to the plurality of memory blocks through a plurality of word lines, the memory controller is configured to designate the at least two memory blocks as the multi block by transmitting to the nonvolatile memory device a multi block address corresponding to two or more of the memory blocks that are connected in common to one of the block driving units,
the address decoder is configured to decode the multi block address and to select the at least two memory blocks of the multi block based on the decoded multi block address, and
the memory controller is configured to transmit a multi block erase command to the nonvolatile memory device, and
the nonvolatile memory device is configured to erase the memory blocks of the multi block during the multi block erase operation in response to receiving the multi block erase command.

18. The nonvolatile memory system of claim 17, wherein
the memory controller is configured to classify the plurality of memory blocks into a plurality of groups based on the memory blocks that are connected to a same one of the block driving units,
the memory controller is configured to determine if one of the plurality of groups includes a bad block,
the memory controller is configured to associate a logical address corresponding to the bad block with a physical address of a normal block from a different one of the plurality of groups if the bad block exists in the one of the plurality of groups, and
the memory controller is configured to exclude the bad block from being included with the at least two memory blocks designated as the multi block.

19. The nonvolatile memory system of claim 17, wherein
the nonvolatile memory device includes a page buffer connected to the plurality of memory blocks through a plurality of bit lines, and
the memory blocks of each one of the planes are connected in common to a corresponding one of the bit lines.

20. The nonvolatile memory system of claim 16, wherein the each of the plurality of memory blocks comprises a non-volatile memory that is monolithically formed in one or more physical levels of memory cells having active areas disposed above a silicon substrate.

* * * * *